United States Patent [19]
Lesley
[11] 3,726,989
[45] Apr. 10, 1973

[54] CIRCUIT MODULE PROVIDING HIGH DENSITY INTERCONNECTIONS

[75] Inventor: Arthur M. Lesley, Woodland Hills, Calif.
[73] Assignee: Hughes Aircraft Company, Culver City, Calif.

[22] Filed: July 27, 1970
[21] Appl. No.: 64,909

[52] U.S. Cl. ..................174/68.5, 29/626, 174/72 B, 174/117 FF, 317/101 CE
[51] Int. Cl. ..........................................H05k 1/04
[58] Field of Search ......................317/106 A, 106 B, 317/106 C, 106 CC, 106 CM, 106 CE, 106 D; 174/68.5, 72 A, 72 B; 29/626

[56] References Cited

UNITED STATES PATENTS

| | | | |
|---|---|---|---|
| 3,418,535 | 12/1968 | Martinell | 317/101 CM |
| 3,567,999 | 3/1971 | Larson et al. | 174/72 B |
| 3,486,076 | 12/1969 | Abbott et al | 174/68.5 X |
| 3,440,722 | 4/1969 | Paulson | 317/101 X |
| 3,474,297 | 10/1969 | Bylander | 317/101 |
| 3,042,591 | 7/1962 | Cado | 174/68.5 X |

*Primary Examiner*—Bernard A. Gilheany
*Attorney*—James K. Haskell and Richard J. Rengel

[57] ABSTRACT

A multilayer conductor strip construction for interconnections in a circuit module is disclosed wherein narrow, flat and elongated sections of multilevel laminations retain the high density characteristic of multilayer construction and lateral extensions of flat conductors outside the laminations expose ends of the conductors at connection sites of a printed circuit board. Uniformly spaced holes in the circuit boards provide the sites for solder connections to circuit components positioned over the strips. The holes are arranged in parallel rows between conductor strips and are staggered to provide for high density interlacing of conductor ends projecting laterally from opposing sides of adjacent strips.

7 Claims, 8 Drawing Figures

INVENTOR.
ARTHUR M. LESLEY,
BY Richard D. Hengel
ATTORNEY.

CIRCUIT MODULE PROVIDING HIGH DENSITY INTERCONNECTIONS

The invention herein described was made in the course of or under a contract or subcontract thereunder with the Department of the Navy.

BACKGROUND OF THE INVENTION

1. Field of the Invention

The present invention relates to circuit modules and more particularly to component connection arrangements for increasing circuit density and flexibility in design changes and repair of circuit modules. A circuit board type module provides a support and interconnections between components of electronic circuitry. The advent of solid-state circuitry and microcircuits has reduced the volume required for components to a degree such that one of the most challenging technical areas lies in reducing the volume required for interconnection of discrete components into the desired circuit arrangement or interconnection of integrated circuits to perform higher levels of functions. With regard to the latter, it should be noted that the volume ratio of the package of an integrated circuit, e.g. "dual in-line" arrangement, to the circuit "chip" contained therein, is not significant when compared to the volume ratio required for interconnection of the integrated circuit on a circuit board of a microelectronic system. For example, a microcircuit computer system may require 70 percent of its volume for interconnections while only 10 percent is required for integrated circuitry. This volume ratio is typical since statistically each integrated circuit package having ten external lead-in terminals, for example, may require one hundred external interconnections.

Significant advances have been made in providing higher levels of functions within the basic integrated circuit chip and large scale integration. However, at the present time, only limited use has been made of large scale integration although more extensive use in the future is anticipated, particularly in data processing systems wherein identical circuits are used in large quantities. Thus, it is generally recognized that there will be a continuing need in electronic equipment for integrated circuits of lower level but more universal function which can be assembled on circuit boards or other carriers and interconnected to provide a variety of system arrangements.

2. Description of the Prior Art

One of the more commonly known methods of increasing circuit density of circuit boards involves burying circuit interconnections in circuit board laminations of a circuit module known as a multilayer circuit board. Connections to components mounted on upper and/or lower disposed surfaces of the multilayer board are provided by "plated-through" holes, for example, which provide conductive paths from the exposed surfaces of the board to buried conductive sheets which are etched in patterns to provide laterally extending interconnecting paths. This prior method provides a high density circuit board construction having as many as 30 layers or laminations in an integral circuit board module. The disadvantage of this type of integrated module construction is in the expense involved in designing and fabricating the module which makes the method too expensive for all but large quantity production.

In the development of commercial electronic equipment, the quantities rarely warrant the expense of these multilayer circuit board modules since these costs cannot be distributed over sufficient quantities to be economical. However, because of the high density, this method is commonly used for military equipment where the smaller volume requirements can be justified in other savings.

Other difficulties inherent in this prior art type of integrated construction have contributed to the need for a more flexible arrangement of circuit board modules which provides high density circuit interconnections. Accordingly, the present invention is directed to a new and improved circuit board module having the advantages of multilayer circuit board module in providing high density circuit interconnections while providing for circuit redesign and changes including repair, without need for extensive relayout followed by photo reduction, and refabrication.

Other prior art circuit packaging arrangements are known which do not provide the high density desired and have other disadvantages which are not present in this invention. For example, several prior art arrangements provide for wrapping wires around pins in an array on a panel board to provide the desired interconnections. In many instances, the wire wrapping involves several wires on each pin which makes changes difficult since the top wire must be removed to make changes or repairs involving other wires on the pin. As a result, if a change involves disturbing only 20 percent of the wires, in most instances less effort is involved by rewiring the whole panel board assembly.

SUMMARY OF THE INVENTION

A circuit module having multilayer connector strips mounted on a carrier provides high density circuit interconnection for circuit components of the module. Strip leads are provided which project from between multilayer laminations at carrier junction sites or holes arranged in parallel rows alongside each connector strip. Adjacent rows of holes are staggered for interlacing of leads projecting from adjacent strips of a connector strip array. The multilayer connector strip array consisting of spaced connector strips having conductive paths with exposed connector strip leads provides the advantages of high density conductive paths for circuit interconnections of integral, multilayer circuit modules. This latter type of integral construction has the disadvantage of burying the conductive paths for interconnections between laminations such that these interconnections are inaccessible for modification or repair without precision drilling equipment. Accordingly, it is an object of the present invention to provide a circuit module having the foregoing features and advantages of high density construction while retaining the advantages of accessibility to interconnections for circuit design changes and repair.

Another object is to provide a circuit module having a larger number of circuits per unit of volume.

A further object of the present invention is the provision of multilayer modular structural arrangement of circuits in which the interconnections are readily accessible.

Still another object is to provide high density circuit connections on a carrier for supporting circuit components wherein junction sites are disposed for flow soldering including assembly line soldering processes.

Other objects and features of the invention will become apparent to those skilled in the art as the disclosure is made in the following detailed description of a preferred embodiment of the invention.

DESCRIPTION OF THE PREFERRED EMBODIMENT

Figures 1, 2, 3, 3A:
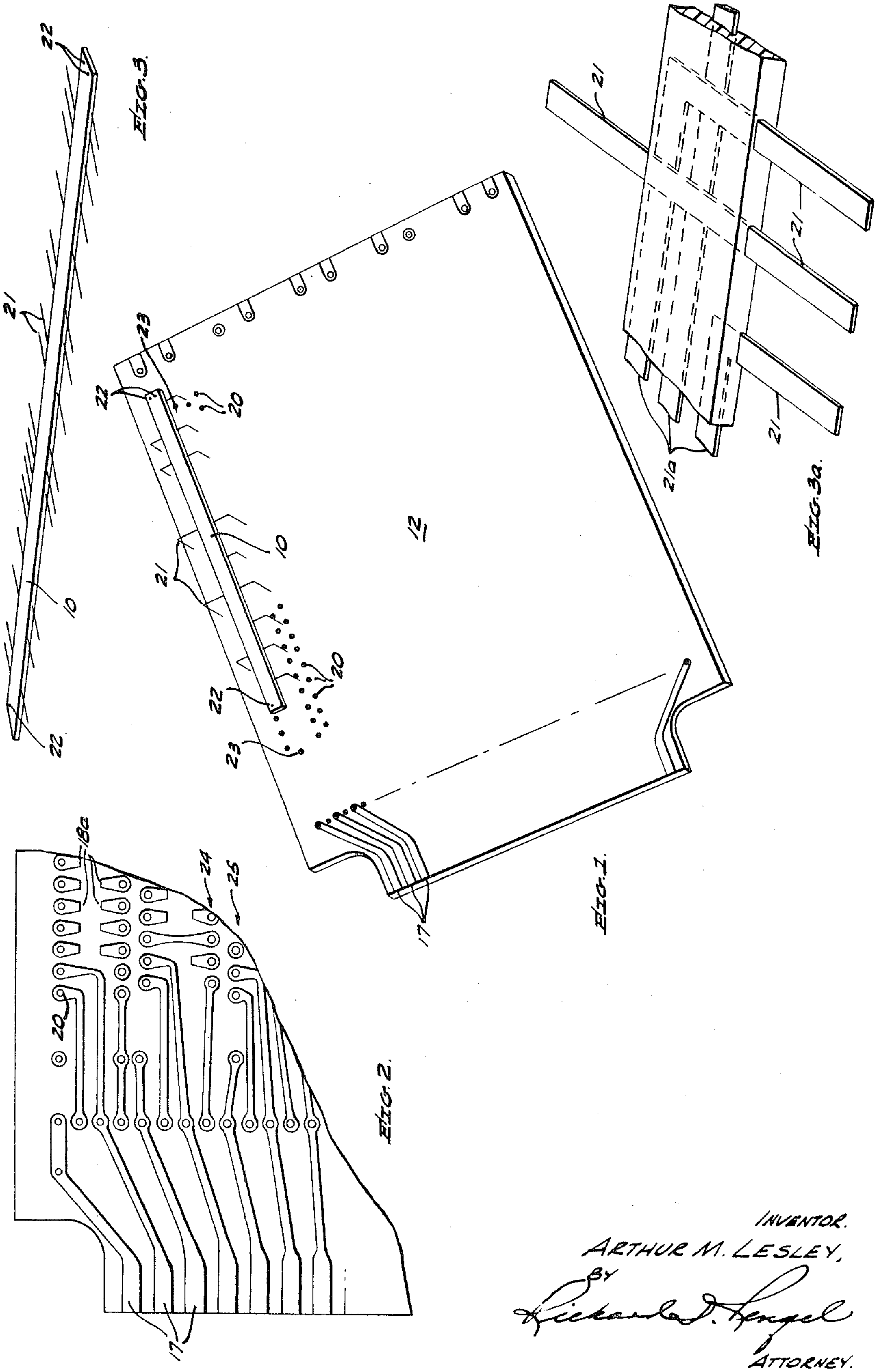
FIG. 1 is a perspective view of the preferred embodiment of the circuit module of the present invention in an initial stage of assembly of basic components including one of the multilayer connector strips and the printed circuit board carrier.
FIG. 2 is an enlarged detail view of a section of the backside of the printed circuit board shown in FIG. 1.
FIG. 3 is a perspective view of the preferred multilayer connector strip showing the laterally projecting terminal leads prior to bending and trimming for assembly.
FIG. 3*a* is a greatly enlarged detailed view of a typical section of the strip shown in FIG. 3 without a thermally conductive, ground shield.
Figure 5:
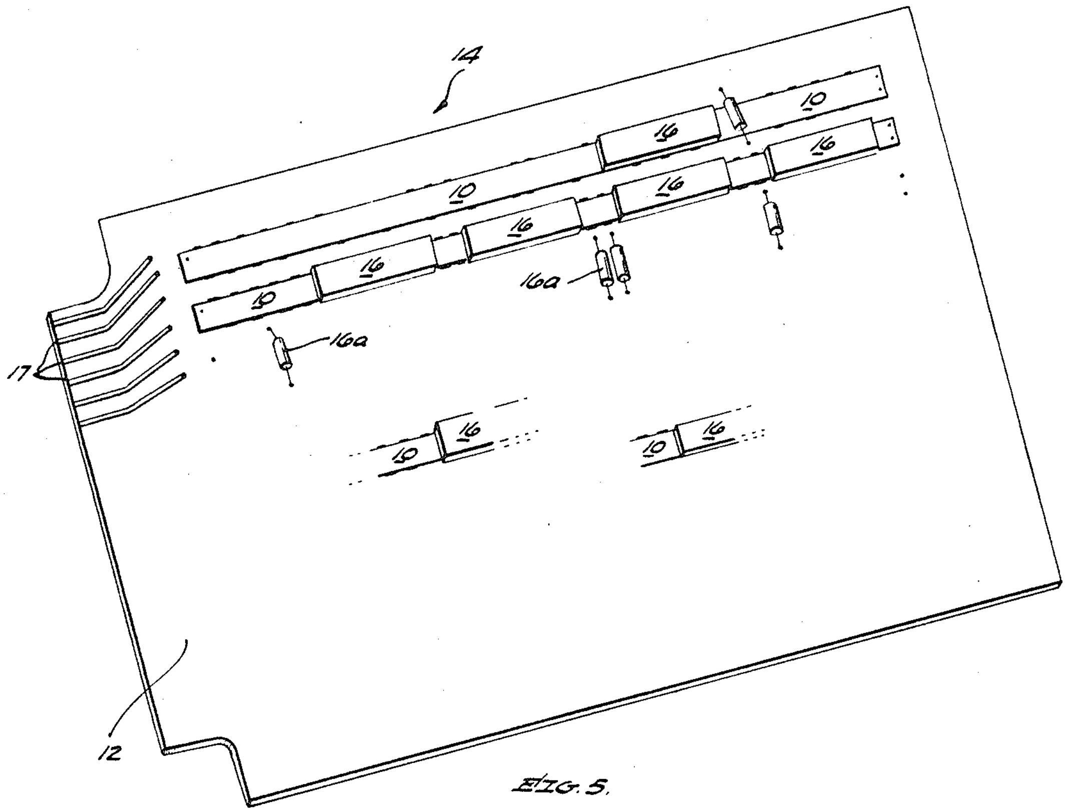
FIG. 5 is a perspective view of an assembled circuit module of the preferred embodiment of the invention showing typical connector strips, components and circuit board details.
Figure 6:
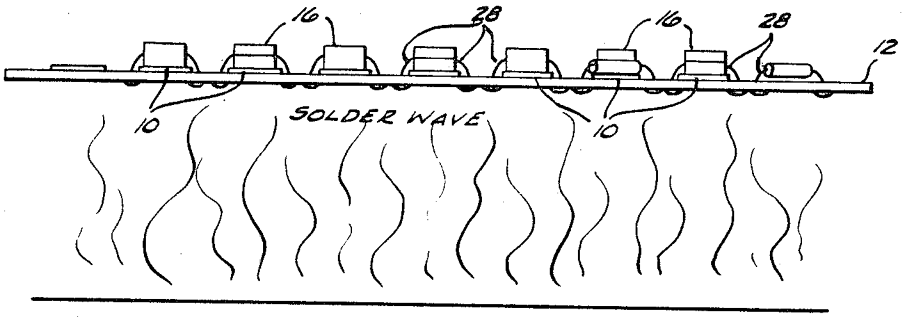
FIG. 6 is an end view of the assembled circuit module shown in FIG. 5 during soldering.

Referring now to the drawings, in FIG. 1 the preferred circuit module of the present invention is illustrated in an initial stage of assembly wherein the multilayer connector strip 10 is shown being mounted on a printed circuit board carrier 12. The completely assembled circuit module 14 of the preferred embodiment is shown in FIGS. 5 and 6, including the multilayer connector strip 10, integrated circuit packages 16, and other circuit components 16*a*.

The printed circuit board 12 comprises a copper clad sheet of epoxy impregnated glass fibers providing a rigid substrate for mounting spaced connector strips 10 and circuit components 16 and 16*a*. The upper and lower surfaces of the carrier 12 have been etched to provide board terminal connections 17, a number of primary interconnections 18 thereto, and solder pads 18a on the underside of the board, as shown in FIGS. 1 and 2. In the preferred arrangement of the present invention, therefore, the printed circuit board carrier 12 includes connection patterns etched on both sides of the board substrate, i.e. double-sided circuit board, including etched pattern 18 providing connections from the board terminals 17 to the connector strips 10 mounted on the central area of the board 12 and designated ones of the solder pads 18*a* about holes 20. These holes 20 are accurately spaced on the circuit board 12 in predetermined parallel rows wherein each of the holes can be located by rectangular coordinates for plotting junction sites and interconnection paths for circuit components 16, 16*a* by connector strips 10. Strip leads 21 projecting from the sides of connector strips 10 and also terminal leads of circuit components including terminal leads of integrated circuit packages 16 are inserted in holes 20 in accordance with a programmed layout and connections are made by application of solder to the underside of the board 12. It should be noted that adjacent rows of holes 21 between strips 10 are staggered to provide interconnections transverse to the direction of the connector strips by interlacing of strip leads 21 from opposing sides of adjacent connector strips 10 as indicated by connector strips 10 in FIGS. 4 and 4a.

Figure 4:
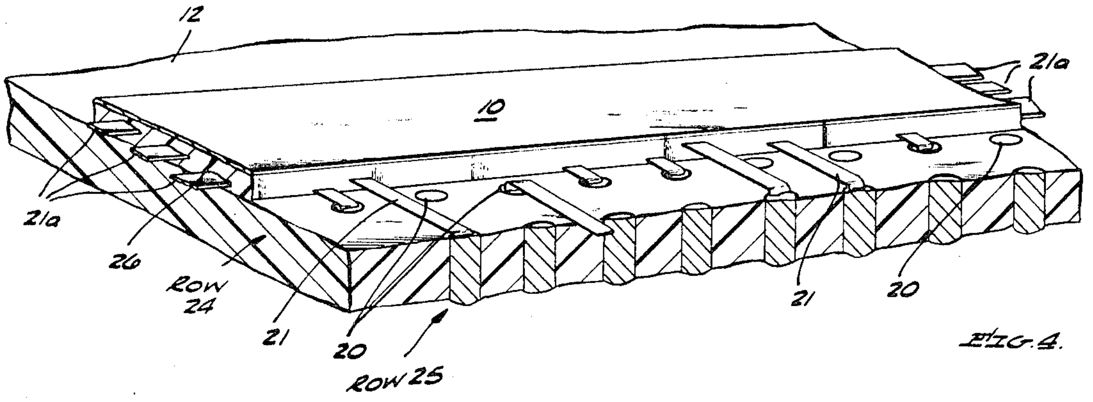
FIGS. 4 and 4*a* are greatly enlarged sectional views of a typical connector strip and circuit board assembly for showing details of the connection arrangement of the preferred embodiment.

Referring to FIG. 3 for a more detailed description of connector strip 10 of the illustrated preferred embodiment, a flat, elongated multilayer structure is shown which is wide enough to accommodate three flat conductors 21 at any point along its length and between each layer of plastic laminations. In the preferred arrangement, the conductors are preformed to interconnect junction sites at selected holes 20 and assembled in channels formed in respective plastic layers without a mechanical bond between conductors and the layers of plastic. These channels are accurately etched in respective glass-epoxy layers of the laminated strip 10, i.e. a glass-epoxy mixture of the type forming the substrate for the circuit board 12. As shown in FIG. 3*a*, many of the conductors 21*a* extend some distance along the length of the connector strip 10 and then project laterally out of the longitudinal edges thereof to provide exposed strip leads 21 which are later formed and trimmed for locating ends thereof in predetermined holes 21 of either row 24 or 25 as illustrated in FIG. 4. The multilayer connector strip 10 provides multilevel conductors for high density interconnections at junction sites in alternate ones of the adjacent set of the staggered rows 24 and 25 and the strip leads 21 are exposed to be readily accessible at the upper surface of the circuit board 12. The set of rows 24, 25 are staggered to provide for interlacing of strip leads 21 from adjacent connector strips 10 and terminal leads of components 16 and 16*a*. Accordingly, every lead in the assembled board is easily accessible from the upperside of the board 12 for circuit design changes including replacement or adding of strips 10 and repair of the circuit connections by soldering irons, wire cutters and the like. Further, due to the high density of connections provided by the connector strips 10, adequate space is provided for mounting of all of the strips 10 and circuit components 16, 16*a* on the upperside of the circuit board 12 and the underside of the board is available for application of solder by flow soldering techniques including solder-wave type soldering machines. Thus, provision is made for soldering connections by an economical assembly line soldering process, as compared to hand soldering or welding of individual connections, for example. As noted, all junctions and leads at these junctions are exposed and therefore accessible for every form of design changes occurring in the circuit refinement during the development of electronic equipment. Further, substantial field design changes and repairs can be made without expensive equipment as required in multilayer circuit having some or all connections completely buried between laminations.

Illustrative of the type of changes which can be made on the circuit board of the present invention that cannot ordinarily be provided in integral multilayer circuit board, involves accessibility to junction sites on the underside of the circuit board 12 wherein any one of the holes 20 can be cleared of solder by means of common soldering iron and vacuum drawing molten solder away from the hole after it is heated to a molten state. Modification or repair can then be made by removal and/or insertion of leads at the site by electrical assembly methods.

Another type of often desired change involves minor redesign. Relocation of connections for redesign is achieved by cutting any one or more of the existing leads projecting from any one or more of the multilayer strips in order to remove the connection. This is followed making the desired connection discussed supra. A more involved redesign may involve substitution or the addition of one or more multilayer strips 10 over an existing multilayer strip on the circuit board 12. In the simpler case, the prior strip 10 is entirely free of components. In the event removal of components is required, the components are later replaced. Adding additional layers to the multilayer strips provides for the addition of independent circuits to a circuit board or circuit module which may have no relation with the previously existing circuitry. In some instances, a more extensive change may require removing an assembled multilayer strip 10 and replacing it with another containing the original connections and additional connections for redesign. Since most of the strips 10 do not use the maximum number of layers, e.g. 10 layers, additional or improved circuits may be provided in the form of a field modification for updating or improving existing equipment. The extent of flexibility for redesign or repair can now be appreciated and further illustrations of the ability to upgrade or provide improved circuitry to an existing module or circuit board should be readily apparent.

As shown in FIG. 3*a*, the conductors **21*a* and strip leads 21 of the connector strip 10 are formed by parallel, flat ribbons of conductor material, e.g. annealed copper or nickel. These conductors 21a and terminal leads 21, which are integral therewith, are preferably formed by etching of a copper sheet to provide the flat ribbons of the desired configuration. These flat ribbons are secured between laminations of the connector strip 10 by location thereof in channels etched in the individual layers of plastic laminations. Because the terminal sites or hole patterns are uniform, the junctions can be identified by an alpha-numeric position for each junction or hole. The positions of the holes being precisely predetermined, optimum circuit interconnections can be determined by computer processing, and arrangement of conductor strip and circuit components can be automatically plotted to provide a desired geometric pattern on photographic film of circuit interconnections for etching of a copper sheet to provide conductors and strip leads spaced at the proper location for junctions with circuit components. In the preferred arrangement, this film is also to etch the conductor channels in the plastic laminations of the connector strip 10. After the connector strips 10 have been assembled, as shown in FIG. 3, the terminal leads 21 are bent and cut by insertion in a tool providing the proper configuration for bending the leads 21** and cutting any excess length to form short and long strip leads shown in FIG. 3*a*. Also, as shown in FIG. 3, tooling holes 22 in strip 10 are provided to assure precise positioning in the tool and later, on the circuit board 12 having positioning holes 23 (FIG. 1) for receiving three long retainer pins (not shown) inserted through the tooling holes 22. Thus, the proper alignment of the connector strip is assured during tooling and mounting of the connector strip 10 on the board 12 to position the ends of strip leads 21 in predetermined corresponding holes 20 in the circuit board 12.

The details of one of the circuit modules actually constructed to provide many of the features of the present invention are now described to further clarify the principles of the present invention. It should be evident that many variations are apparent to those skilled in the art and the description which follows is exemplary and the invention is not intended to be restricted thereto. The carrier 12 consists in a rigid printed circuit board 12 providing a support for circuit components 16 and connection strips 10. As shown in FIGS. 1 and 2, circuit board terminals 17 at one edge of the board 12 provide for "plug-in" connection of the circuit board 12 to a panel board (not shown) which is wired to interconnect circuit boards 12 of a group into an electronic system. All of the circuit components 16, 16a and connector strips 10 are mounted on the upperside of the board 12 to simplify soldering of connections in a flow solder machine, as illustrated in FIG. 6. A flow solder machine is capable of applying solder to the underside of the board 12 to deposit solder in holes 20 as the board passes over the solder wave. As the circuit board passes over the solder wave, the solder enters the holes 20 in the board including holes in rows 24 and 25 across the width of the board 12.

As illustrated in FIG. 5, the completed board 12 includes a series of connector strips 10. Connector strips 10 are disposed in parallel relation and spaced to provide for laterally extending strip leads 21 and component leads 28 to be joined by solder in holes 20 located in staggered rows 24 and 25 between each of the connector strips 10.

Figure 4A:
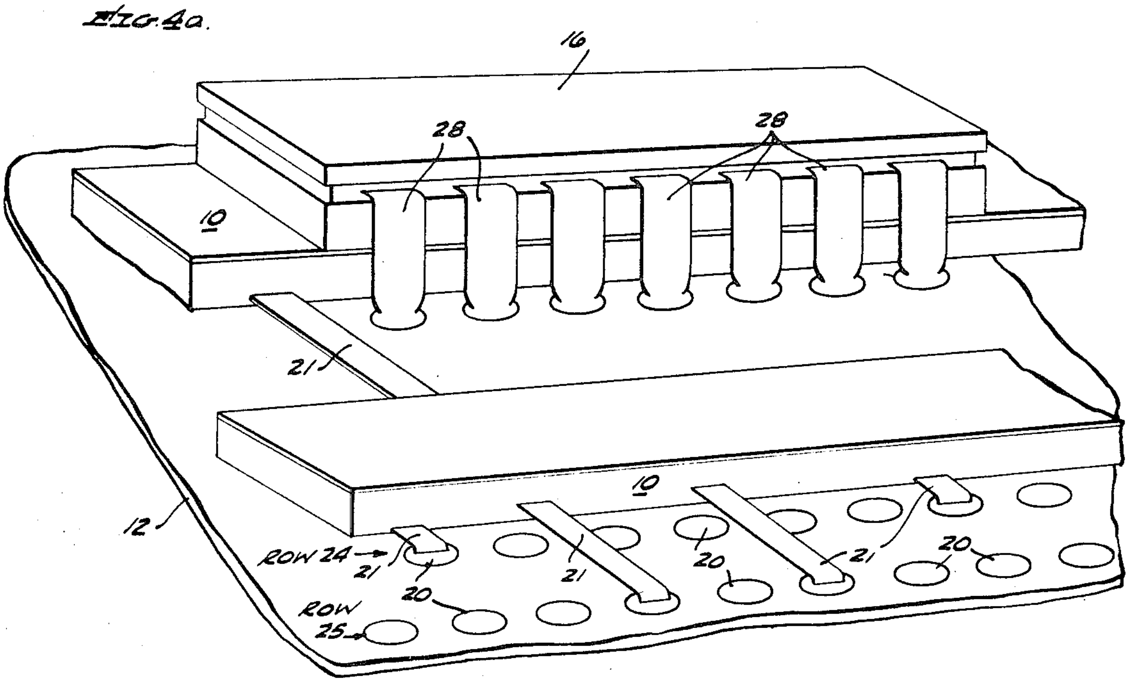

In the provision of parallel spaced connector strips 10, the width of the connector strip is predetermined to accommodate integrated circuit packages 16 disposed on top of the strips with terminal leads 28 projecting down past the strip and into the holes 20 along with the strip leads 21 as shown in FIGS. 4 and **4*a*. A typical integrated circuit package 16 comprises a "dual in-line" package shown including two or more integrated circuits and having terminal leads 28 extending from the longitudinal edges thereof. Commercially available integrated circuit packages vary in the number of terminal leads 28; however, the standard for spacing of these leads is uniform to 0.1 inch (100 mils). Accordingly, the holes 20 in inner and outer rows 24 and 25 (relative to any one strip 10) are accurately and uniformly spaced to receive the terminal leads 28 from integrated circuit packages 16. Also, the maximum width of the connector strip is predetermined, approximately, by the width of the integrated circuit package 16 to provide for the terminal leads 28 projecting down past the longitudinal sides of the strips 10, as shown in FIG. 4*a*. In following the standard width, the strip leads projecting laterally from the sides of the strip 10 are spaced to be received in holes 20 of the inner and outer (staggered) rows 24 and 25. Accordingly, the minimum spacing between strip leads 21 along either edge of strip 10 is 50 mils to provide for a maximum number of leads to holes 20 in both rows 24 and 25. To accommodate this maximum density of strip leads 21 on one side of the strip 10, the conductors are 25 mils wide to provide a minimum spacing of 25 mils between adjacent strip leads. Alternate long and short strip leads 21 extending from either one of the sides of strip 10 are received by holes 20 in rows 24 and 25 to correspond to the maximum hole density in any row of 100 mils and 50 mils including both rows 24 and 25**.

As shown in FIG. 3a, a connector strip 10, having a width of 280 mils, will accommodate three flat conductors of 25 mils width, side by side at the same level with a resulting spacing of approximately 75 mils between conductors 21*a*. Conductors 21*a*, as shown more clearly in FIG. 3*a*, are disposed at different levels to accommodate crossovers as often required to project laterally out of opposite longitudinal sides of the strip 10. For the purpose of clarity, only three levels of conductors 21*a* have been shown in FIG. 3*a* to illustrate typical cross-overs including a conductor 21a projecting directly across the strip 10. It should be realized that conductors 21*a* may extend substantially the length of the strip 10 to provide predetermined connections between components located near the ends of the strip 10.

In accordance with the details of the constructed module 14, the connector strips 10 are shown mounted on the circuit board 12 in FIGS. 4 and 4a and located between rows spaced by 350 mils to receive the integrated circuit package terminal leads 28, strip 10 and strip leads 21. Nonadjacent rows 25 are spaced by 600 mils and are staggered relative to holes 20 in adjacent rows 24 to receive longer strip leads 21*a* without crossing over the holes 20 in inner rows 24. In this manner, strip leads 21 extending to the outer rows 25, relative to any particular strip 10, will not pass over holes 20 in the inner rows 24, whereby inner rows 24 are accessible for other leads including terminal leads 28 from integrated circuit packages 16.

In view of the foregoing, it should now be apparent that the connector strips 10 maintain the advantages of high density interconnections of multilayer construction while retaining accessibility to all of these interconnections and junctions therefor for circuit modification. In addition, the strips 10 in combination with the junction sites adjacent the longitudinal edges provide for locating the circuit components including integrated circuit packages 16 over the strip 10 with terminal leads of the integrated circuit packages projecting down to the junction sites or holes 20 for connection into the circuits of the module 14 by conductors disposed between laminations of the connector strip 10. The circuit module arrangement of elongated connector strips 10 and rows of holes 21 provide a high density circuit construction such that all components of the circuit module are accessible from the upperside of the board including connector strips 10 for soldering the leads disposed in holes 20 by passing the underside of the circuit module 14 over a solder wave provided by assembly line soldering machines, as illustrated in FIG. 6.

Preferably, connector strips 10 further include a thermally conductive ground shield 26, as shown in FIG. 4. This thermally conductive ground shield 26 dissipates heat from the circuit components mounted over the strip 10 and isolate the conductors 21*a* from stray fields by grounding of the shield 26 at a conveniently located ground terminal.

While a preferred embodiment of the invention has been disclosed, it should be clear that the present invention is not limited thereto as many variations will be readily apparent to those skilled in the art without departing from the spirit and scope of the invention as defined by the following claims.

What is claimed is:

1. A circuit module for providing high density interconnections comprising:

a circuit board carrier for mounting circuit components including integrated circuits having terminal leads projecting from at least a pair of opposite sides thereof to be secured to the circuit board carrier;

a group of multilayer conductor strips disposed on said circuit board carrier, said strips comprising conductors having exposed leads projecting laterally from the opposite sides thereof to be secured to the circuit board carrier and connected to predetermined ones of the terminal leads and the strip leads to provide the high density interconnections; and a row of openings provided in said circuit board along the opposite edges of said strips and openings in adjacent rows between strips are staggered to provide for strip leads from opposing sides of adjacent strips to project across and into openings in either of adjacent columns without passing over openings in an adjacent column.

2. A circuit module of claim 1 in which said circuit board carrier includes areas of conductive material bonded to the circuit board at said openings to provide solder pads and conductor strip leads and terminal leads are secured in said openings and connected by solder adhering to said areas and leads in respective openings.

3. A circuit module of claim 2 in which said areas of conductive material are disposed on one side of the carrier to provide junction sites and circuit components and strips are mounted on the other side of the carrier so that solder is applied by passing the circuit board over a wave of molten solder which deposits solder in said openings to secure said leads in said openings and connect leads in respective openings.

4. A circuit module providing high density circuit interconnections on a printed circuit board comprising:

a printed circuit board carrier having a circuit board terminal end having terminals for connecting the circuit module to other circuits in a system circuit arrangement, a plurality of rows of junction sites laterally spaced across the circuit board and extending from the area of the terminal end of the carrier;

a plurality of elongated, multilayer strips mounted on said carrier to be substantially parallel to said rows for providing interconnections transversely across the circuit board carrier, said strips including conductors having terminal portions projecting laterally therefrom for connection to respective, laterally spaced junction sites in said rows, said conductors including those extending substantially the length of said strips for connection to terminals at the terminal end of said carrier and transverse conductors projecting across said strips to provide respective terminal portions on each side of the respective strip for transverse interconnections between circuits disposed transversely across the circuit board carrier including interconnections between conductors and terminal sites remotely located transversely across the carrier.

5. The circuit module according to claim 4 in which said transverse conductor projecting across said strips include conductors extending along at least a portion of the length of said strip between terminal portions on each side of the respective strip to provide individual isolated interconnections across said strips to junction sites in rows on opposite sides of said strips for interconnections transversely across the circuit board carrier.

6. The circuit module according to claim 4 in which a plurality of rows of junction sites are provided between said strips and said junction sites are staggered for interlacing of terminal portions extending laterally from opposing sides of adjacent strips.

7. The circuit module according to claim 4 in which said circuit board carrier includes printed circuitry for interconnections on the under surface thereof and said junction sites comprise respective openings for receiving said conductor terminal portions for connection to the printed circuitry.

* * * * *